(12) United States Patent
Chen

(10) Patent No.: US 9,609,761 B2
(45) Date of Patent: Mar. 28, 2017

(54) METHOD OF MOUNTING SELF-ADHESIVE SUBSTRATE ON ELECTRONIC DEVICE

(71) Applicant: Hung-Chang Chen, Taipei (TW)

(72) Inventor: Hung-Chang Chen, Taipei (TW)

( * ) Notice: Subject to any disclaimer, the term of this patent is extended or adjusted under 35 U.S.C. 154(b) by 231 days.

(21) Appl. No.: 14/505,516

(22) Filed: Oct. 3, 2014

(65) Prior Publication Data

US 2016/0100491 A1    Apr. 7, 2016

(51) Int. Cl.

| | |
|---|---|
| *H05K 3/30* | (2006.01) |
| *H05K 1/02* | (2006.01) |
| *F21V 19/00* | (2006.01) |
| *H05K 1/18* | (2006.01) |
| *H05K 3/00* | (2006.01) |
| *F21Y 101/00* | (2016.01) |
| *F21Y 105/10* | (2016.01) |
| *F21Y 115/10* | (2016.01) |

(52) U.S. Cl.
CPC .......... *H05K 3/305* (2013.01); *F21V 19/005* (2013.01); *H05K 1/028* (2013.01); *F21Y 2101/00* (2013.01); *F21Y 2105/10* (2016.08); *F21Y 2115/10* (2016.08); *H05K 1/189* (2013.01); *H05K 3/0052* (2013.01); *H05K 3/0064* (2013.01); *H05K 3/0097* (2013.01); *H05K 2201/053* (2013.01); *H05K 2201/10106* (2013.01); *H05K 2201/10113* (2013.01); *H05K 2201/2054* (2013.01)

(58) Field of Classification Search
CPC .... B23K 1/002; B23K 2201/32; B23K 31/02; F21V 19/005; F21Y 2115/10; H05K 3/0097; H05K 3/305
USPC ................................ 228/175; 156/60, 272.2
See application file for complete search history.

(56) References Cited

U.S. PATENT DOCUMENTS

2014/0159963 A1*    6/2014   Den ................. G06K 19/07722
343/700 MS

* cited by examiner

*Primary Examiner* — Erin Saad

(57) ABSTRACT

A method of mounting a self-adhesive substrate on an electronic device comprising steps of: (S01) providing a base for mounting at least one self-adhesive substrate thereon, wherein each self-adhesive substrate includes a copper circuit layer formed thereon, an insulated adhering layer adhered with the copper circuit layer and made of glue with thermal conductive powders, and a release layer attached with the insulated adhering layer; (S02) forming the at least one self-adhesive substrate on the base based on a profile or a circuit configuration of a fixing portion of an accommodating member of an electronic device; (S03) welding a plurality of electronic elements on the copper circuit layer of each self-adhesive substrate; (S04) removing each self-adhesive substrate; (S05) removing the release layer from each self-adhesive substrate to adhere each self-adhesive substrate on the fixing portion of the accommodating member of the electronic device.

9 Claims, 32 Drawing Sheets

METHOD OF MOUNTING SELF-ADHESIVE SUBSTRATE ON ELECTRONIC DEVICE

FIELD OF THE INVENTION

The present invention relates to a method of mounting a self-adhesive substrate on an electronic device which is employed to mount the self-adhesive substrate on the electronic device directly so that heat is transmitted to air from a plurality of electronic elements via the self-adhesive substrate and the electronic device.

BACKGROUND OF THE INVENTION

Referring to FIG. 1, a conventional LED bulb 1' contains: a seat 11', a connecting mount 12', a control module 13', a circuit substrate 14', and a shade 15'. The circuit substrate 14' includes a plurality of LED elements 16' welded thereon and is manually locked on a fixing portion 112' of the seat 11' by using two screws 141', a first orifice 111', and a second orifice 142'. Furthermore, two wires 143' of the circuit substrate 14' are inserted through an aperture 113' of the fixing portion 112' to electrically connect with the control module 13' in the connecting mount 12, such that the plurality of LED elements 16' is driven by the control module 13' to illuminate lights.

However, the conventional LED bulb 1' still has disadvantages as follows:

1. The conventional LED bulb 1' cannot be produced easily, because the circuit substrate 14' is manually locked on the fixing portion 112' of the seat 11'.

2. The circuit substrate 14' is used to hold the plurality of LED elements 16', the plurality of LED elements 16' is electrically connected with the control module 13' in the connecting mount 12 via the circuit substrate 14', but the circuit substrate 14' is made of fiberglass, heat from the plurality of LED elements 16' cannot be dissipated easily.

The present invention has arisen to mitigate and/or obviate the afore-described disadvantages.

SUMMARY OF THE INVENTION

The primary object of the present invention is to provide a method of mounting a self-adhesive substrate on an electronic device is employed to mount the self-adhesive substrate on the electronic device directly so that heat is transmitted to air from a plurality of electronic elements via the self-adhesive substrate and the electronic device.

To obtain the above objective, a method of mounting a self-adhesive substrate on an electronic device provided by the present invention contains steps of:

(S01) providing a base for mounting at least one self-adhesive substrate thereon, wherein each self-adhesive substrate includes a copper circuit layer formed thereon, an insulated adhering layer adhered with the copper circuit layer and made of glue with thermal conductive powders, and a release layer attached with the insulated adhering layer;

(S02) forming the at least one self-adhesive substrate on the base based on a profile or a circuit configuration of a fixing portion of an accommodating member of an electronic device;

(S03) welding a plurality of electronic elements on the copper circuit layer of each self-adhesive substrate;

(S04) removing each self-adhesive substrate;

(S05) removing the release layer from each self-adhesive substrate to adhere each self-adhesive substrate on the fixing portion of the accommodating member of the electronic device.

DETAILED DESCRIPTION OF THE PREFERRED EMBODIMENTS

Figure 1:
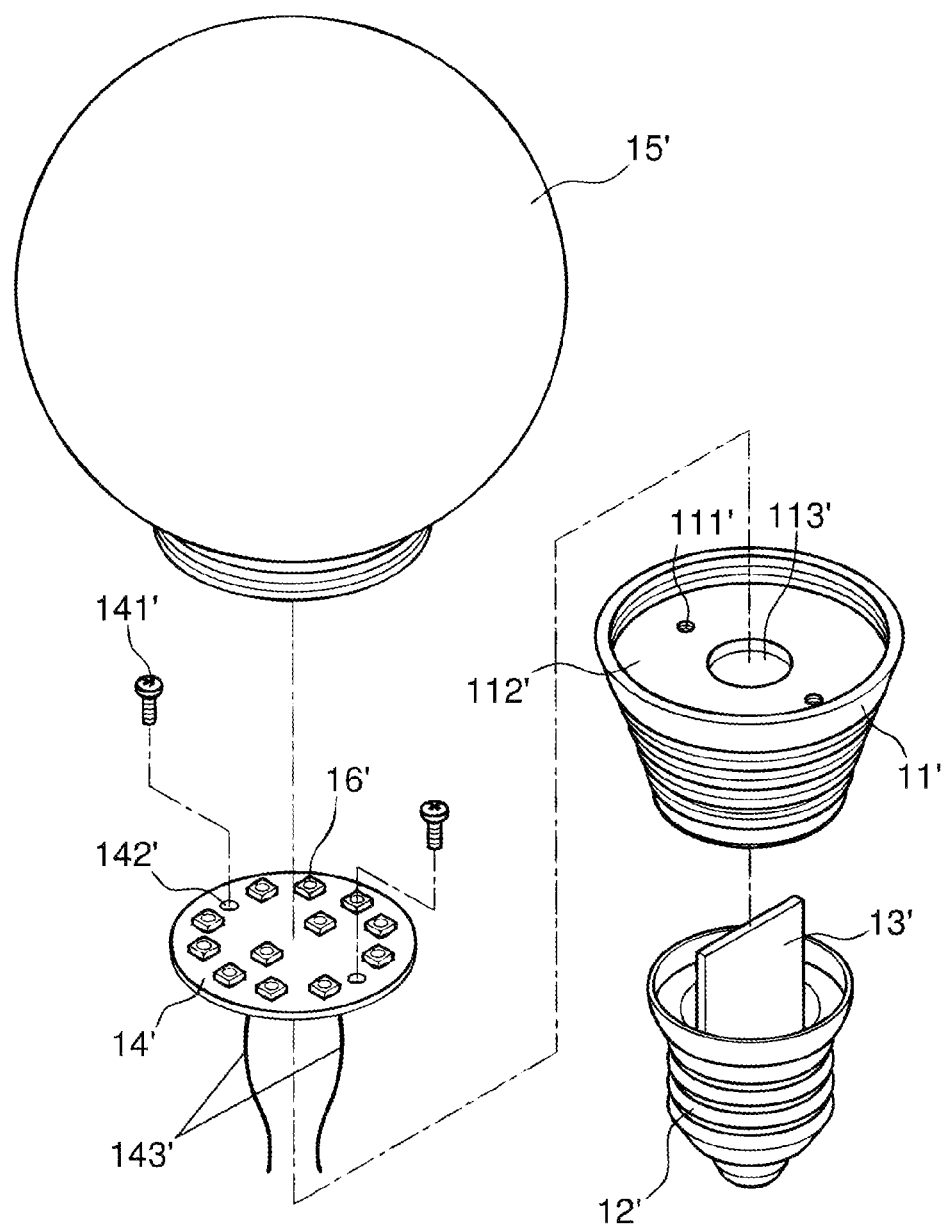
FIG. 1 is a perspective view showing the exploded components of a conventional LED bulb.
Figure 2:
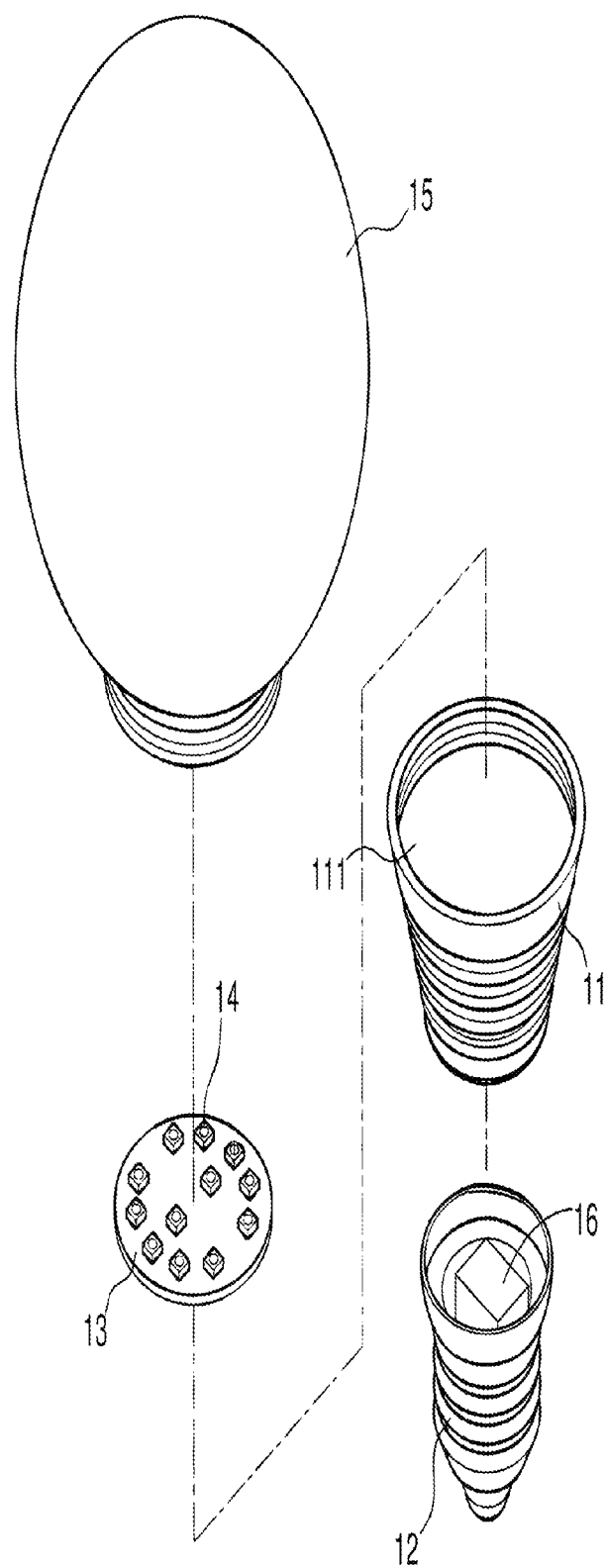
FIG. 2 is a perspective view showing the exploded components of a LED bulb according to a preferred embodiment of the present invention.

A method of mounting a self-adhesive substrate on an electronic device according to a preferred embodiment of the present invention is employed to mount at least self-adhesive substrate in an electronic device, such as a LED bulb, as shown in FIG. 2. The LED bulb comprises an accommodating member 11, a connecting seat 12, at least one self-adhesive substrate 13, and a peripheral shade 15.

Figure 3:
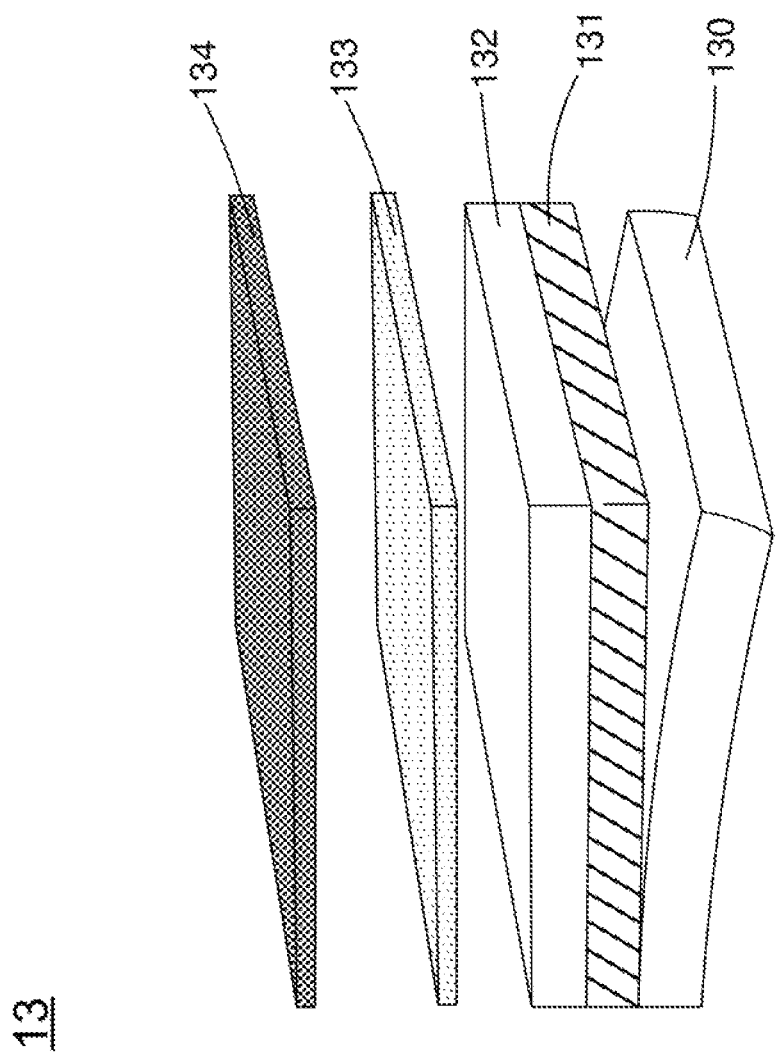
FIG. 3 is a perspective view showing the exploded components of a self-adhesive substrate in the LED bulb according to the preferred embodiment of the present invention.

With reference to FIGS. 2 and 3, each self-adhesive substrate 13 includes a copper circuit layer 132 formed thereon and welded with a plurality of electronic elements 14, an insulated adhering layer 131 adhered with the copper circuit layer 132 and made of glue with thermal conductive powders, and a release layer 130 attached with the insulated adhering layer 131. The at least one self-adhesive substrate 13 is mounted on a fixing portion 111 of the accommodating member 11, and the copper circuit layer 132 is electrically connected with a driving module 16 in the connecting seat 12. Each self-adhesive substrate 13 also includes a first insulation layer 133 adhered on the copper circuit layer 132 to protect the copper circuit layer 132 and includes a printing layer 134 printed on the first insulation layer 133, wherein the printing layer 134 is printed or coated a white paint to reflect lights of the LED bulb. Preferably, the printing layer 134 is printed or coated a green paint, a yellow paint or other colorful paints to be applicable for other electronic devices.

Figure 4:
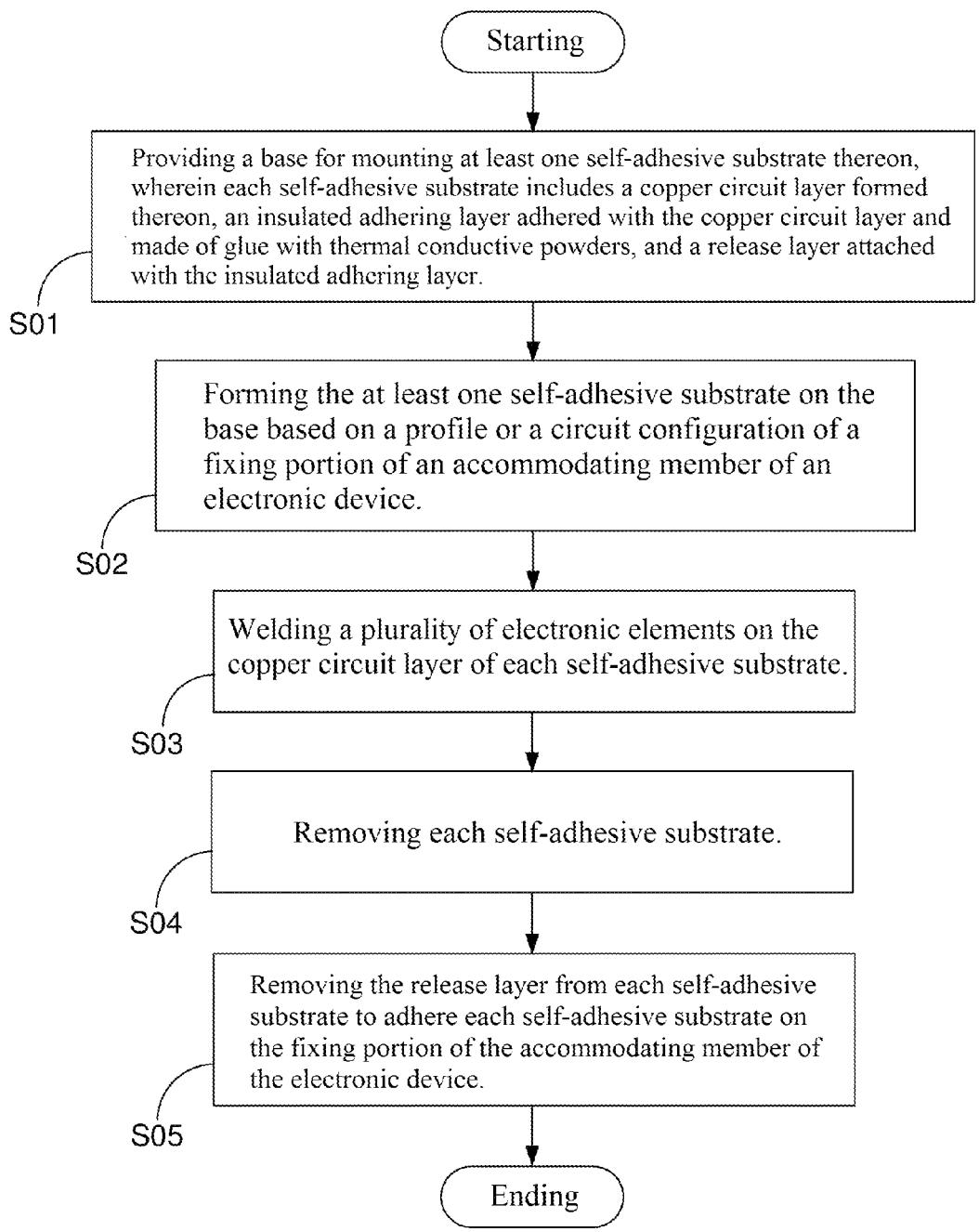
FIG. 4 is a flow chart of a method of mounting a self-adhesive substrate on an electronic device according to a preferred embodiment of the present invention.
Figure 5:
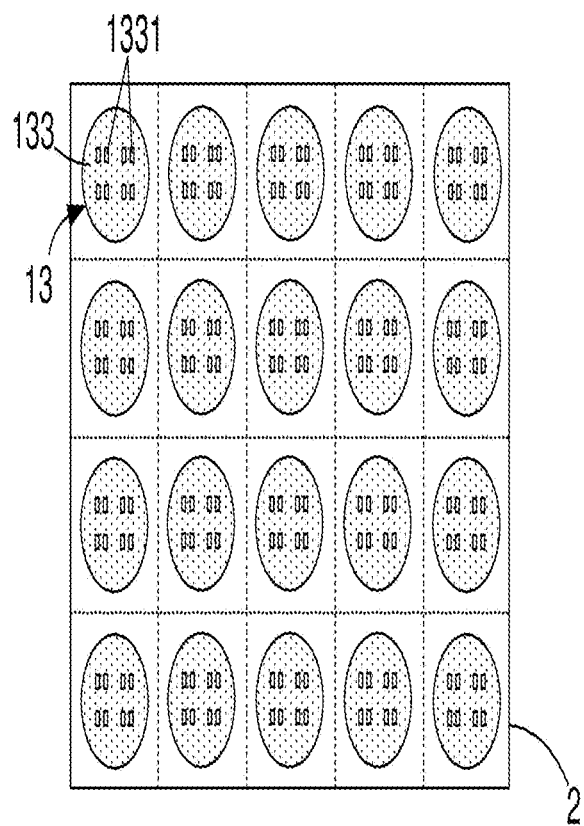
FIG. 5 is a top plane view of a base of a self-adhesive substrate according to the preferred embodiment of the present invention.

With reference to FIGS. 4 and 5, a method of mounting a self-adhesive substrate on an electronic device according to a preferred embodiment of the present invention comprises a step of: (S01) providing a base 2 for mounting at least one self-adhesive substrate 13 thereon, wherein each self-adhesive substrate 13 includes a copper circuit layer 132 formed thereon, an insulated adhering layer 131 adhered with the copper circuit layer 132, and a release layer 130 attached with the insulated adhering layer 131, as shown in FIG. 3. Referring further to FIGS. 3 and 5, a first insulation layer 133 is covered on the copper circuit layer 132 and has plural welding orifices 1331 to expose a plurality of welding bosses on the copper circuit layer 132. In addition, a printing layer 134 is printed on the first insulation layer 133.

Figure 6A:
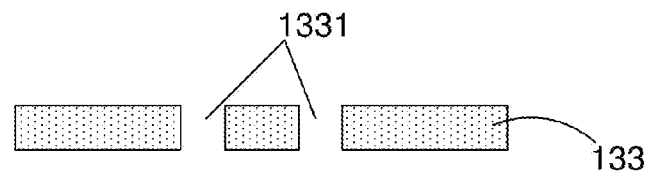
FIGS. 6A to 6F are cross sectional views showing manufacturing a base according to the preferred embodiment of the present invention.
Figure 6B:
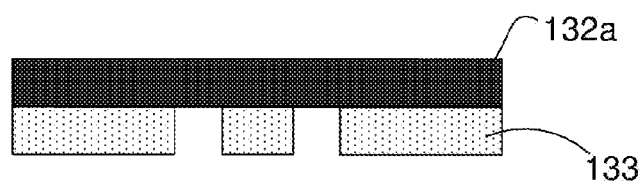
Figure 6C:
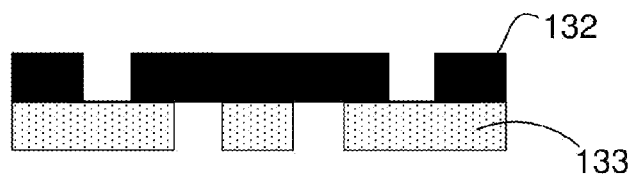
Figure 6D:
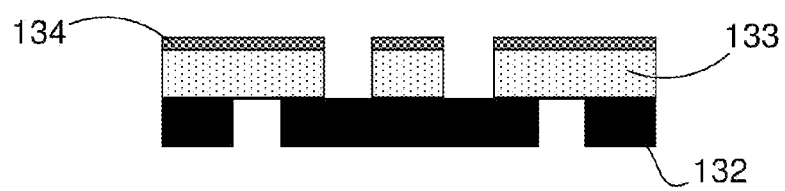
Figure 6:
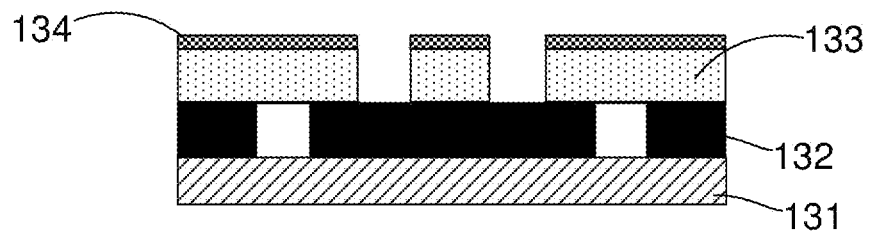
Figure 6:
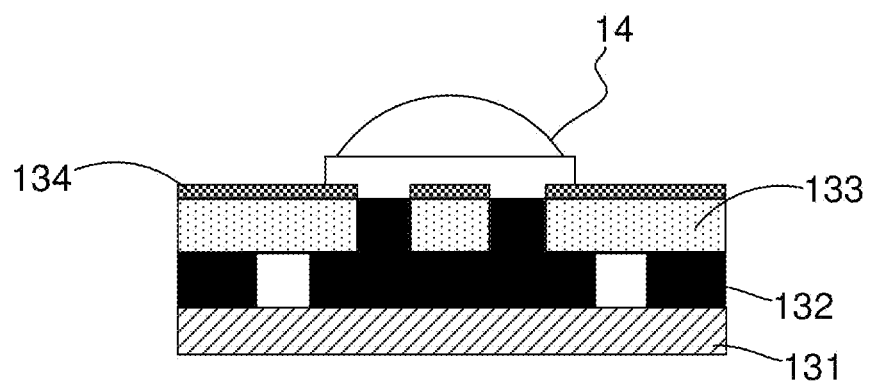
Figure 7A:
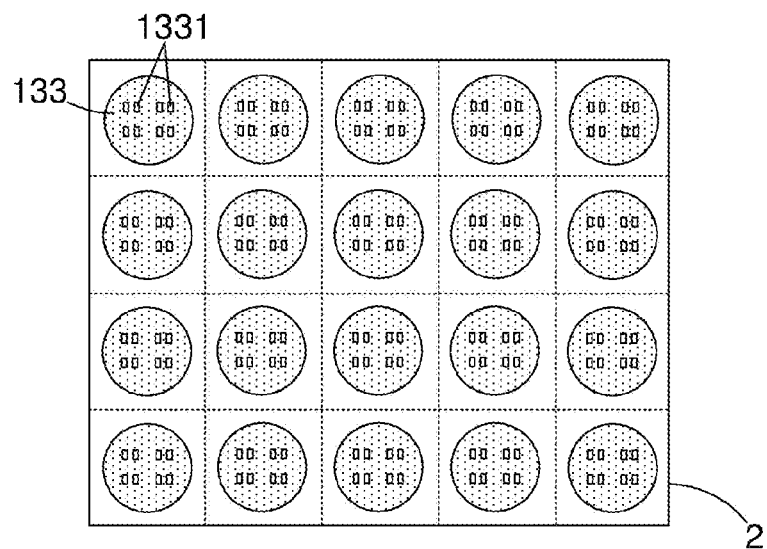
FIGS. 7A to 7F are top plane views showing manufacturing the base according to another preferred embodiment of the present invention.
Figure 7B:
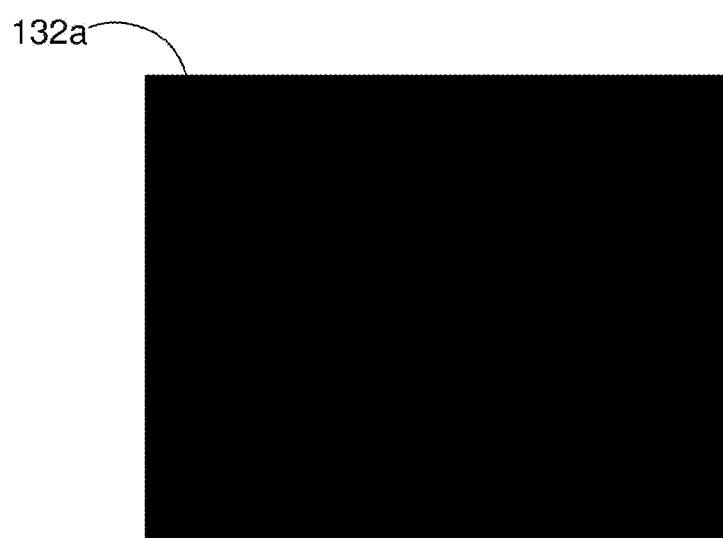
Figure 7C:
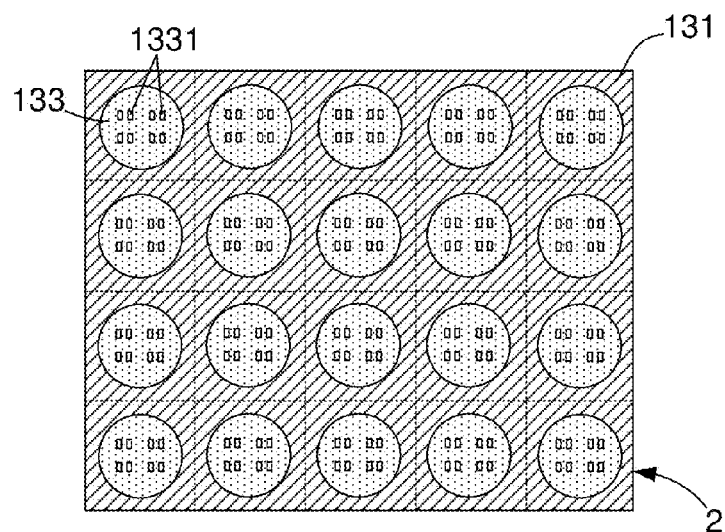
Figure 7D:
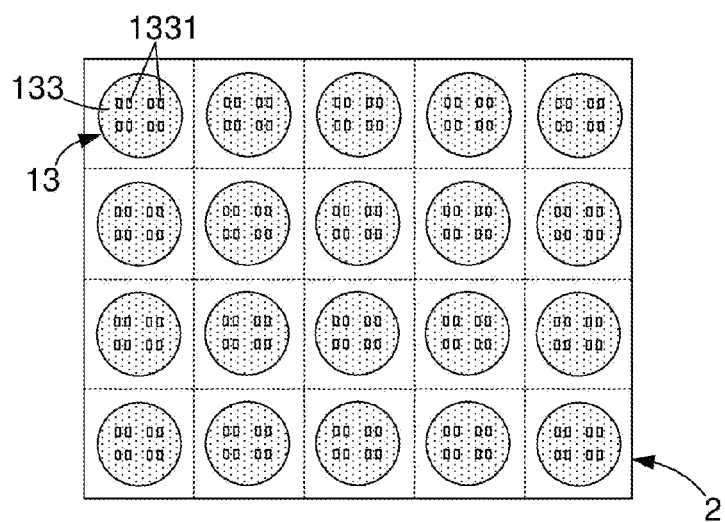

A method of manufacturing the base 2 includes steps of: providing and processing the first insulation layer 133 so that the plural welding orifices 1331 are formed on the first insulation layer 133, as illustrated in FIGS. 6A and 7A (taking the LED bulb for example, the plural welding orifices 1331 are formed on the first insulation layer of the LED bulb); adhering the first insulation layer 133 with a copper layer 132a, as shown in FIGS. 6B and 7B; processing the copper layer 132a to form the copper circuit layer 132, as illustrated in FIGS. 6C and 7C; printing the printing layer 134 on the first insulation layer 133 as shown in FIG. 6D; adhering the insulated adhering layer 131 with the copper circuit layer 132 to form the base 2 as illustrated in FIGS. 6E and 7C.

Thereafter, the method of mounting the self-adhesive substrate on the electronic device further comprises a step of (S02) forming the at least one self-adhesive substrate 13 on the base 2 based on a profile or a circuit configuration of a fixing portion 111 of an accommodating member 11 of an electronic device 1. For instance, as shown in FIG. 2, the electronic device 1 is a LED bulb, and the fixing portion 111 of the accommodating member 11 is circular, so the at least one self-adhesive substrate 13 is circular.

Figure 8:
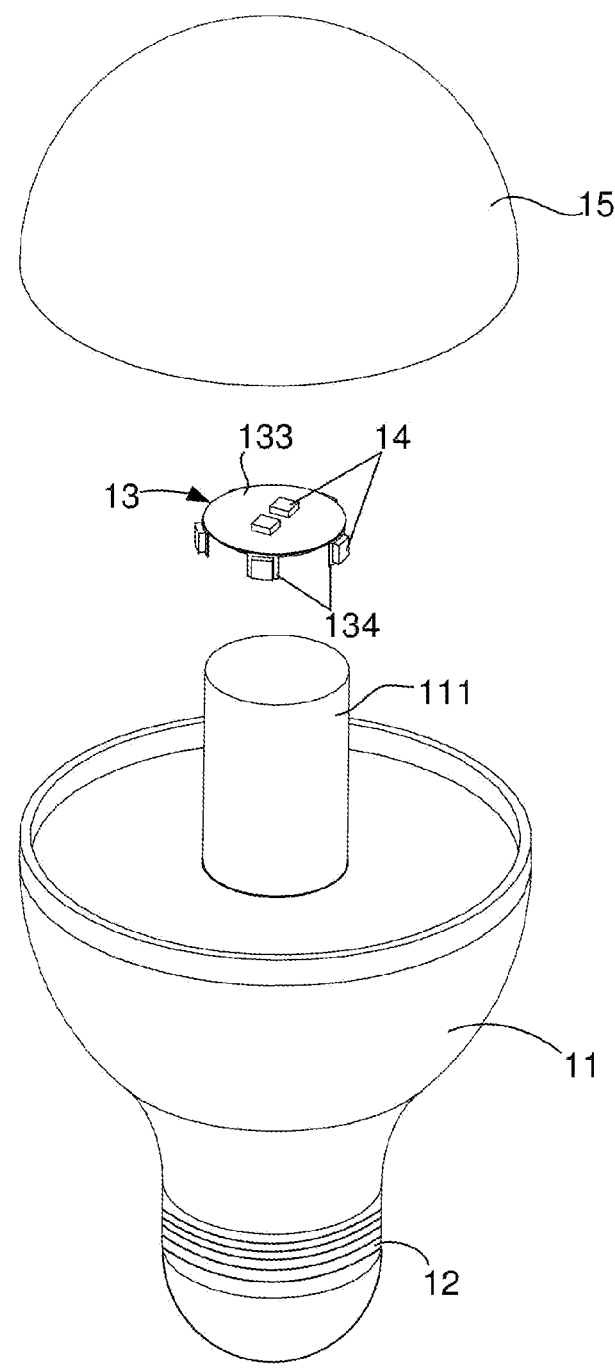
FIG. 8 is a perspective view showing the exploded view of the electronic device according to another embodiment of the present invention.
Figure 9:
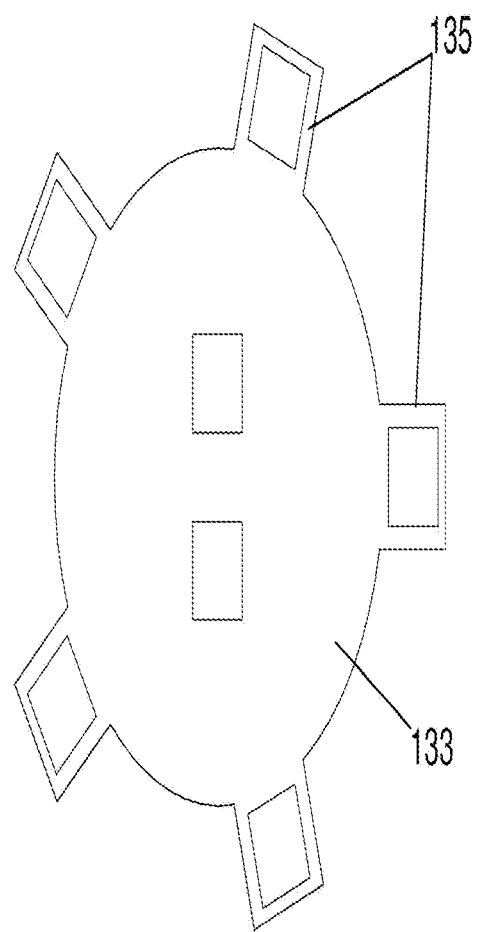
FIG. 9 is a top plane view of a self-adhesive substrate according to another preferred embodiment of the present invention.

With reference to FIG. 8, the electronic device 1 is an omni-directional LED bulb, and the fixing portion 111 of the accommodating member 11 is 360 degrees of a circular column or a polygonal column. Referring to FIG. 9, the self-adhesive substrate 13 has a central area 133b and plural bending zones 135, wherein the self-adhesive substrate 13 is fixed on a top surface of the fixing portion 111, the central area 133b is formed on a top surface of the self-adhesive substrate 13, and the plural bending zones 135 are arranged around a peripheral side of the self-adhesive substrate 13 and are bent downwardly to contact with a peripheral wall of the fixing portion 111, as shown in FIG. 8.

Figure 10A:
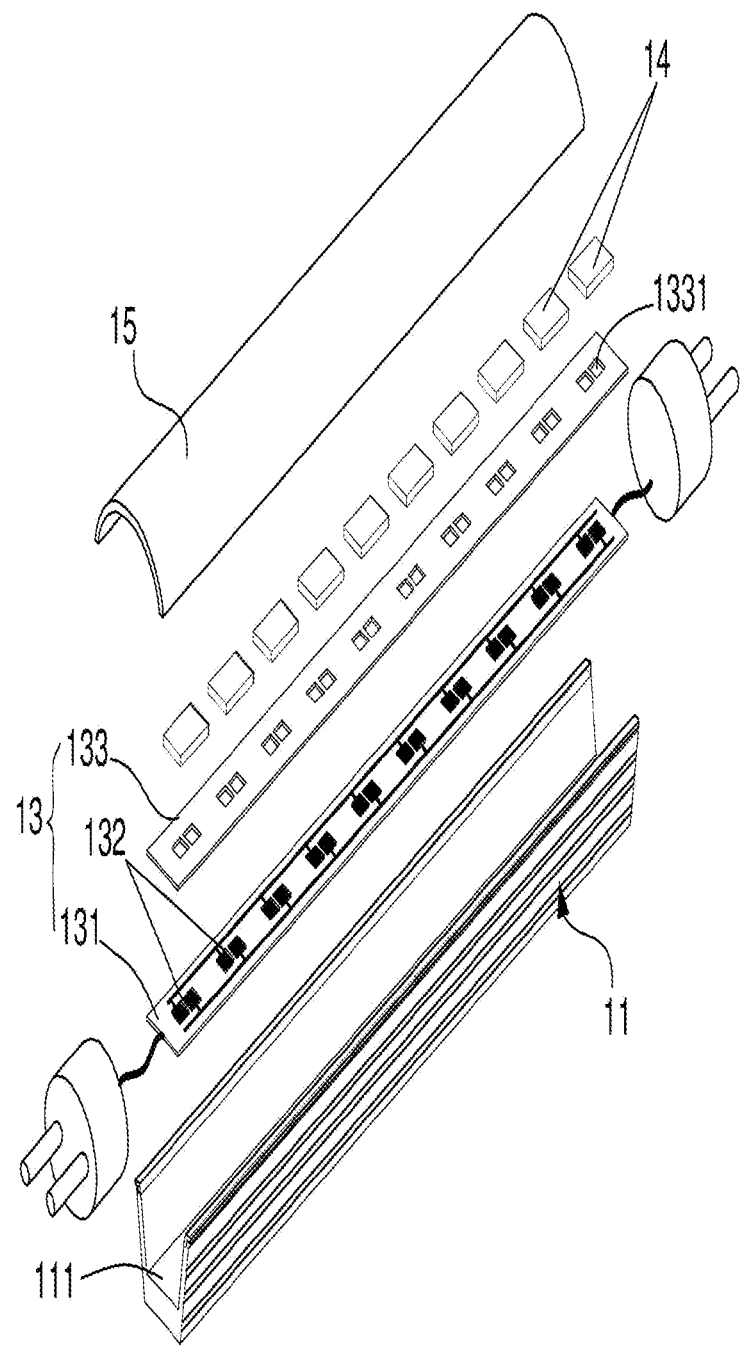
FIG. 10A is a perspective view showing the exploded components of a LED fluorescent lamp according to another preferred embodiment of the present invention.

With reference to a FIG. 10A, the electronic device 1 is a LED fluorescent lamp, and the fixing portion 111 of the accommodating member 11 is elongated, a self-adhesive substrate 13 includes an elongated insulated adhering layer 131, an elongated copper circuit layer 132, and an elongated first insulation layer 133 which are accommodated in the elongated fixing portion 111 of the accommodating member 11.

Figure 10B:
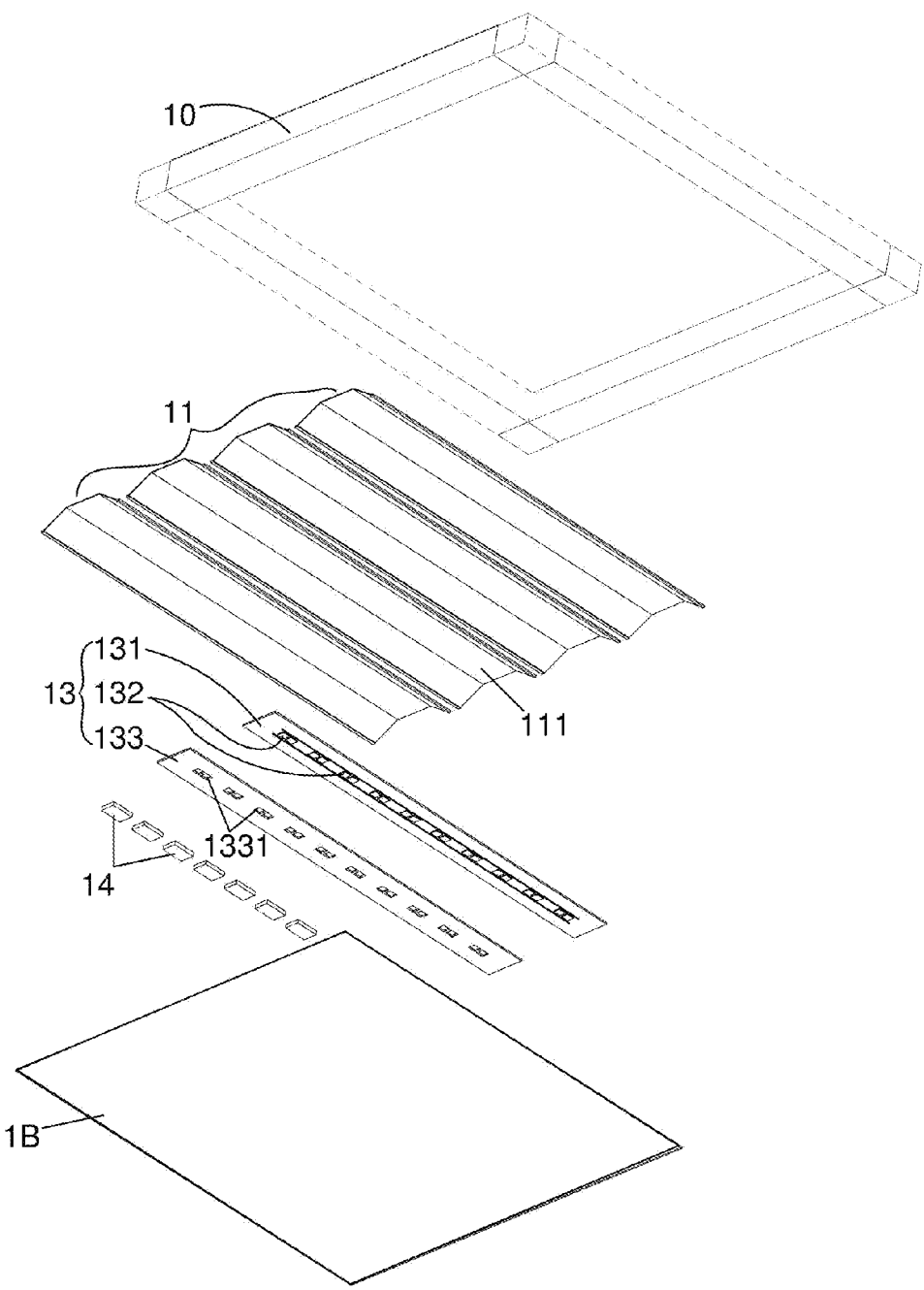
FIG. 10B is a perspective view showing the exploded components of a LED grille light according to another preferred embodiment of the present invention.

Referring to FIG. 10B, the electronic device 1 is a LED grille lamp, and the LED grille light includes a square frame 10, a square accommodating members 11, and a square diffusion plate 1B, wherein the square accommodating member 11 is a concave lighting housing and has plural elongated fixing portions 111 to accommodate plural self-adhesive substrates 13, and each self-adhesive substrate 13 includes an elongated insulated adhering layer 131, an elongated copper circuit layer 132, and an elongated first insulation layer 133 which are accommodated on each elongated fixing portion 111 of the square accommodating member 11.

Figure 11:
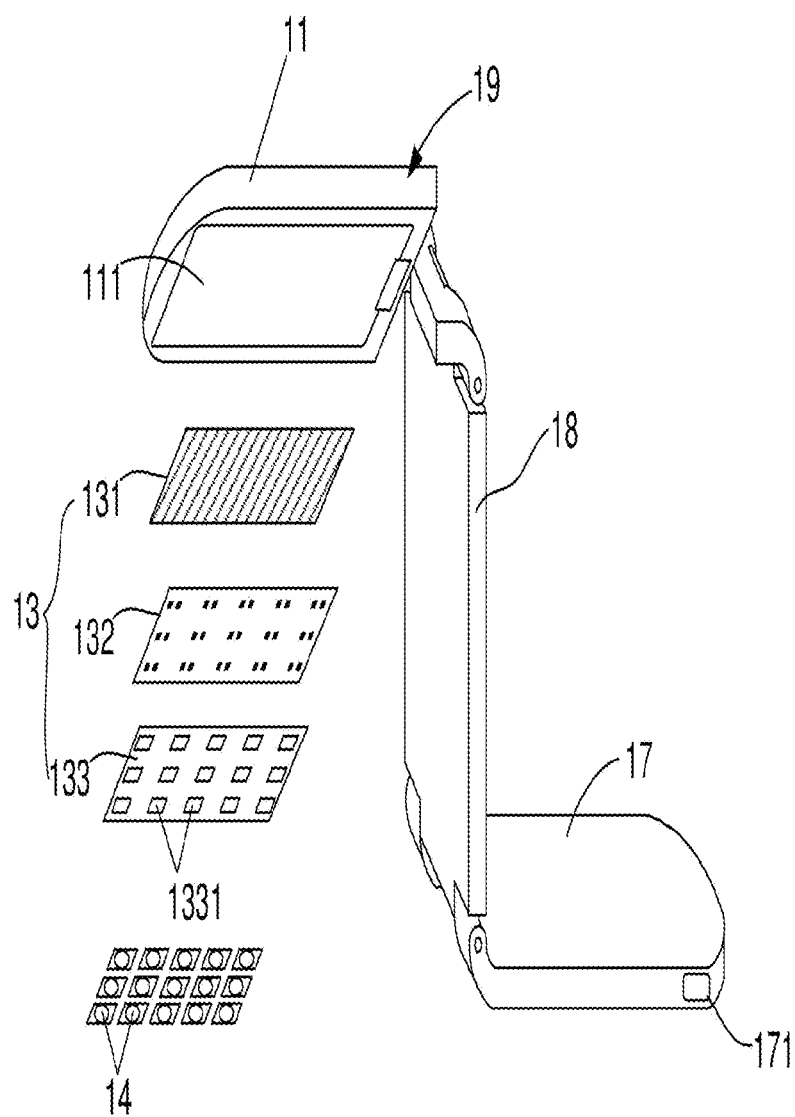
FIG. 11 is a perspective view showing the exploded components of a LED desk lamp according to another preferred embodiment of the present invention.

As shown in FIG. 11, the electronic device 1 is a LED desk lamp, and the LED desk lamp includes a holder 17, a support rack 18, and an illumination module 19; wherein the illumination module 19 includes an accommodating member 11, and the accommodating member 11 has a square fixing portion 111; a self-adhesive substrate 13 includes a square insulated adhering layer 131, a square copper circuit layer 132, and a square first insulation layer 133 which are accommodated on the square fixing portion 111 of the accommodating member 11.

Figure 12:
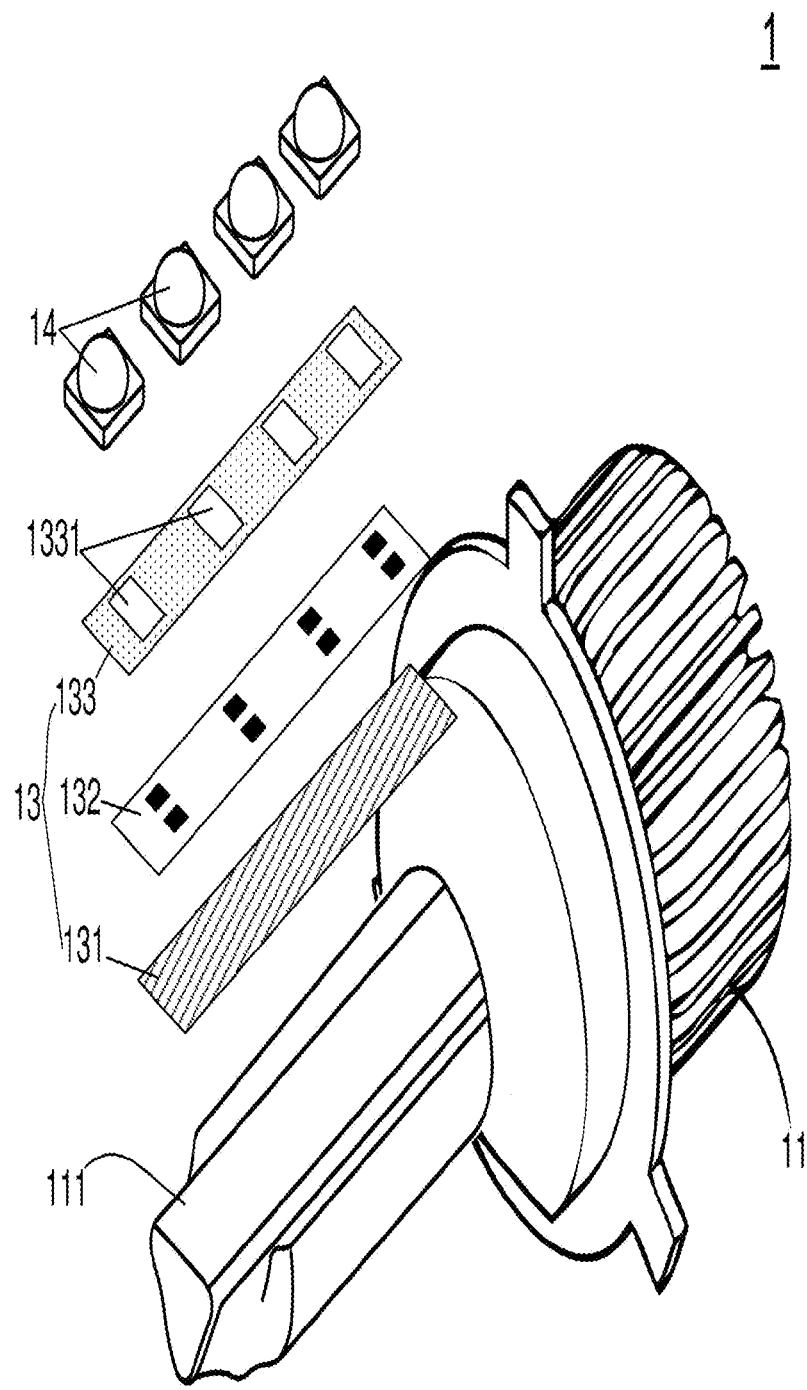
FIG. 12 is a perspective view showing the exploded components of an automobile LED light according to another preferred embodiment of the present invention.

As illustrated in FIG. 12, the electronic device 1 is an automobile LED light, and the automobile LED light includes an accommodating member 11 which has a fixing portion 111 formed in a column shape and extending outwardly form the accommodating member 11; a self-adhesive substrate 13 includes an insulated adhering layer 131, a copper circuit layer 132, and a first insulation layer 133 which are accommodated on the fixing portion 111 of the accommodating member 11.

Figure 13:
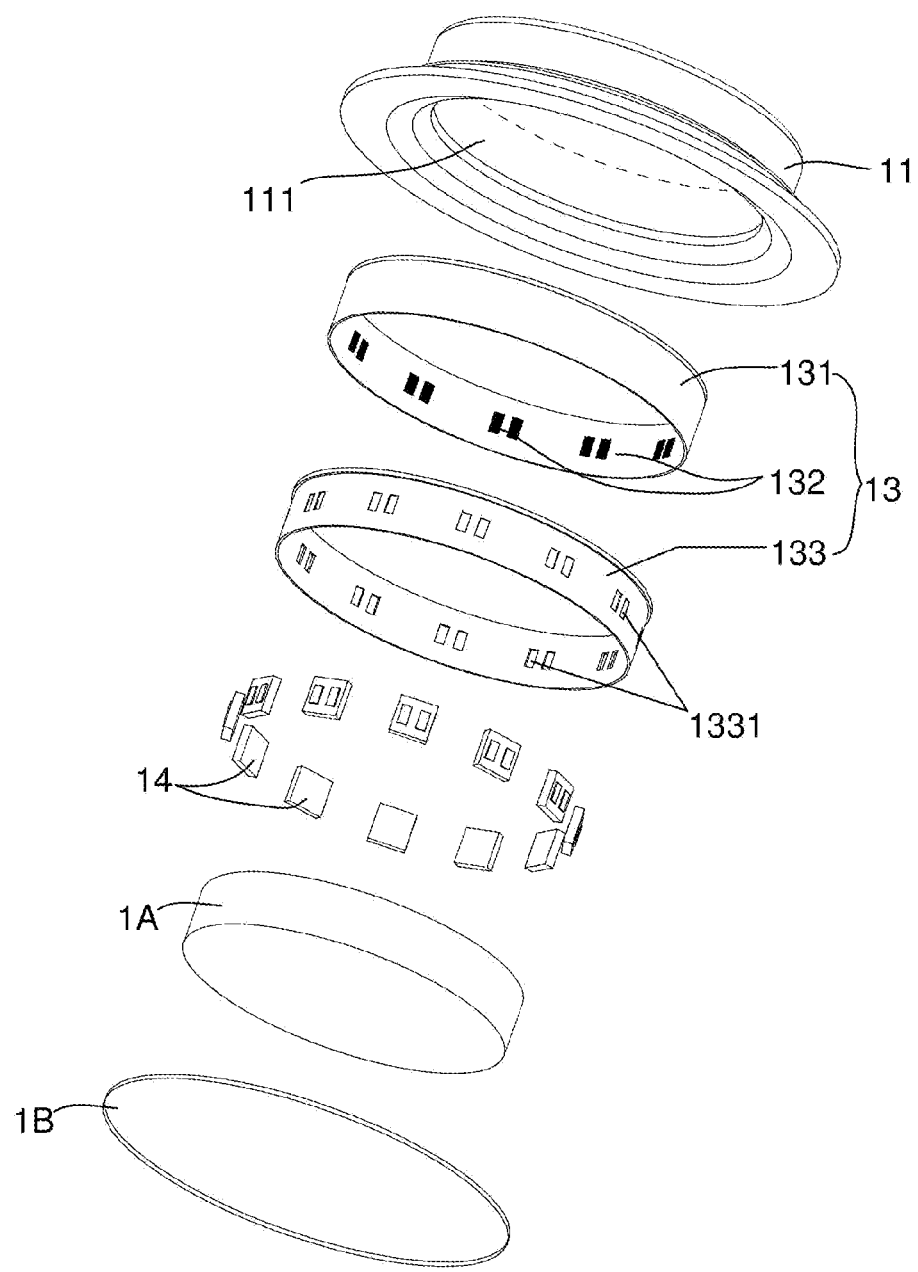
FIG. 13 is a perspective view showing the exploded components of a LED ring light according to another preferred embodiment of the present invention.

With reference to FIG. 13, the electronic device 1 is a LED ring light, and the LED ring light includes an accommodating member 11, a light guiding plate 1A, and a diffusion plate 1B; wherein the accommodating member 11 has an annular fixing portion 111; a self-adhesive substrate 13 includes an annular insulated adhering layer 131, an annular copper circuit layer 132, and an annular first insulation layer 133 which are accommodated in the fixing portion 111 of the accommodating member 11.

Figure 14:
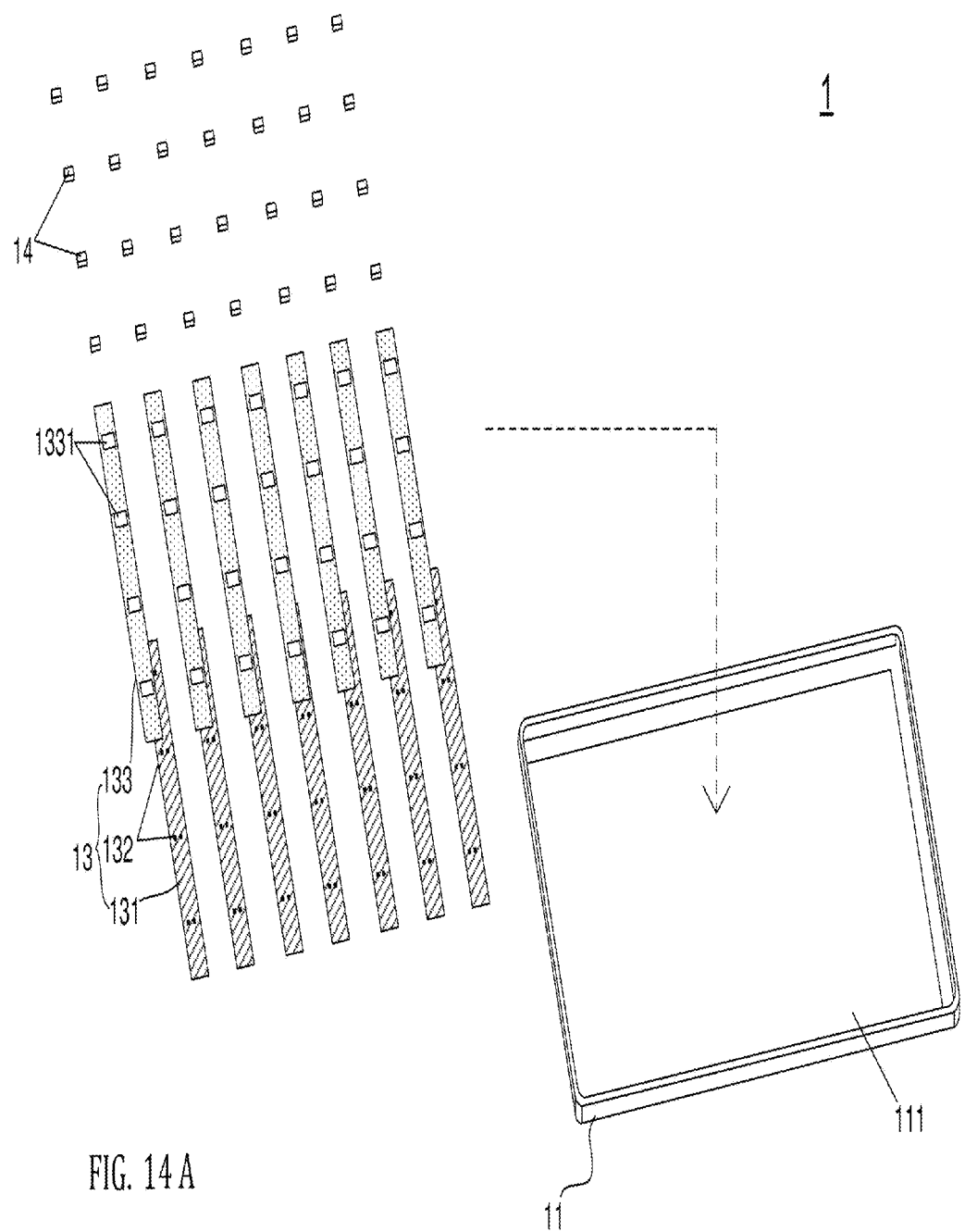
FIG. 14A is a perspective view showing the exploded components of a LED backlight according to another preferred embodiment of the present invention.
FIG. 14B is a perspective view showing the exploded components of another LED backlight according to another preferred embodiment of the present invention.

Referring to FIG. 14A, the electronic device 1 is a LED backlight, and the LED backlight includes an accommodating member 11 adapted for a back holder of a Tablet PC; wherein the accommodating member 11 has a flat fixing portion 111. The electronic device 1 also includes a plurality of elongated self-adhesive substrates 13, and each elongated self-adhesive substrate 13 includes an elongated insulated adhering layer 131, an elongated copper circuit layer 132, and an elongated first insulation layer 133 which are accommodated in the fixing portion 111 of the accommodating member 11 in an array manner. Preferably, as shown in FIG. 14A, each elongated self-adhesive substrate 13 is connected with each of the plurality of electronic elements 14 to form a LED light bar. In addition, the method of mounting the self-adhesive substrate on the electronic device is employed to other LED illumination devices, such as LED streetlights, LED cylinder lights, LED ceiling lights, LED candle bulbs, LED bulbs, LED lighting tubes, LED energy-saving lamps, LED art lamps, or LED accessory lights. Preferably, the self-adhesive substrate on the electronic device is also applied to other electronic devices, such as a LED display or a cell phone. In addition, each electronic element is any one of a LED chip, an integrated circuit chip, a capacitor, a resistor, an inductor, a transformer, an oscillator, and a sensor.

Figure 14B:
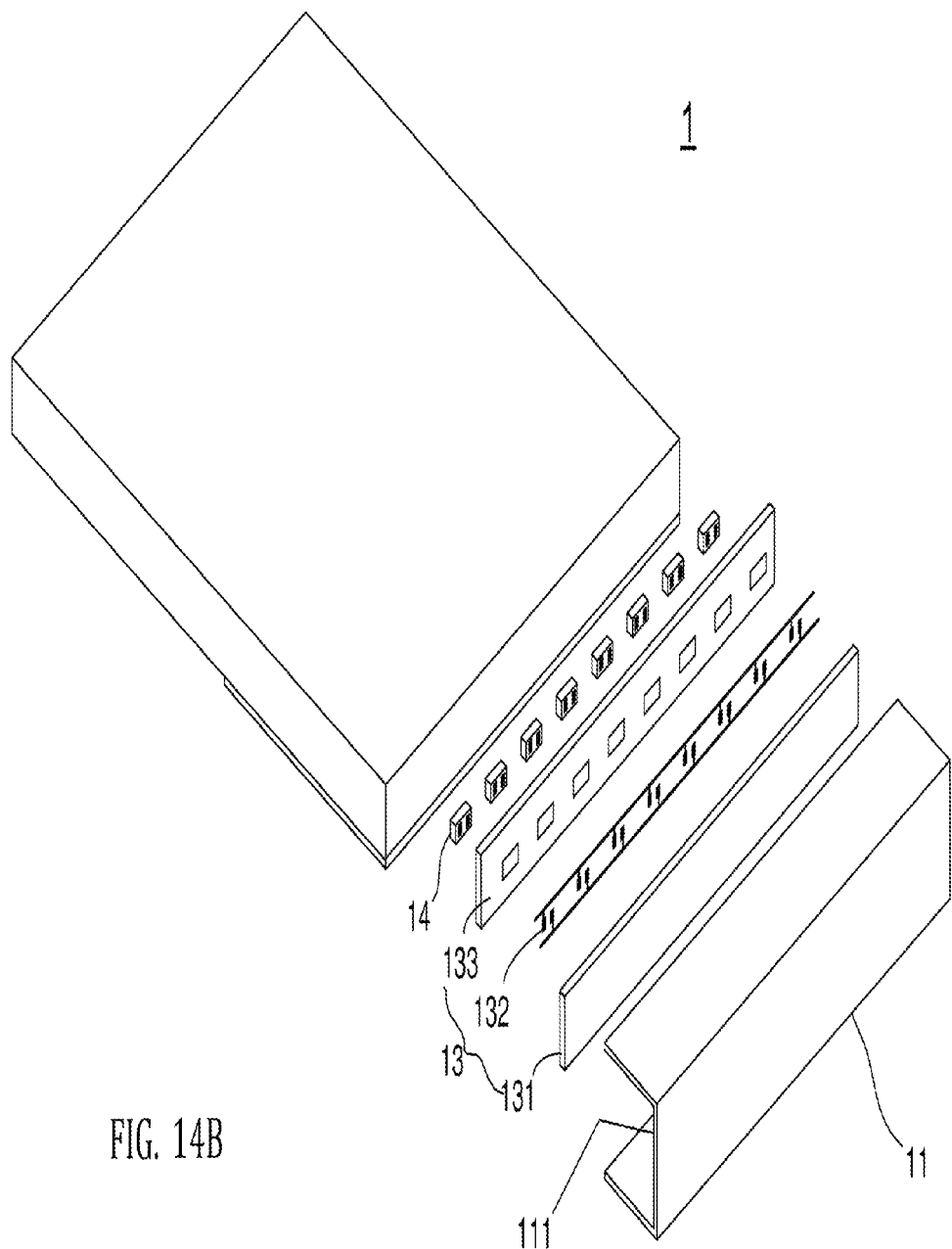

As illustrated in FIG. 14B, the electronic device 1 is a LED backlight, and the LED backlight includes a C-shaped accommodating member 11, wherein the accommodating member 11 has a flat fixing portion 111. The electronic device 1 also includes an elongated self-adhesive substrate 13, and the elongated self-adhesive substrate 13 includes an elongated insulated adhering layer 131, an elongated copper circuit layer 132, and an elongated first insulation layer 133 which are accommodated on the flat fixing portion 111 of the accommodating member 11.

Figure 7E:
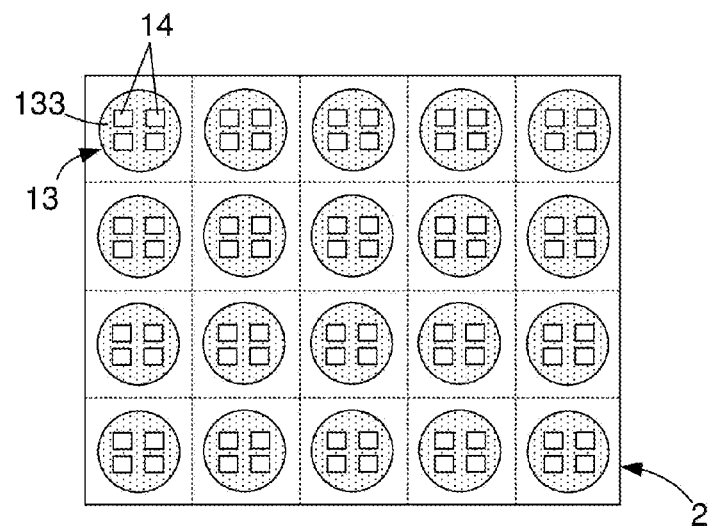

With reference to FIGS. 4, 6F, and 7E, the method of mounting the self-adhesive substrate on the electronic device further comprises a step of (S03) welding the plurality of electronic elements 14 on the copper circuit layer 132 of each self-adhesive substrate 13, and delivering the base 2 to a testing area so as to test each electronic element. For example, when each electronic element 14 is a LED element, each self-adhesive substrate 13 is tested to illuminate the LED lamp.

Figure 7F:
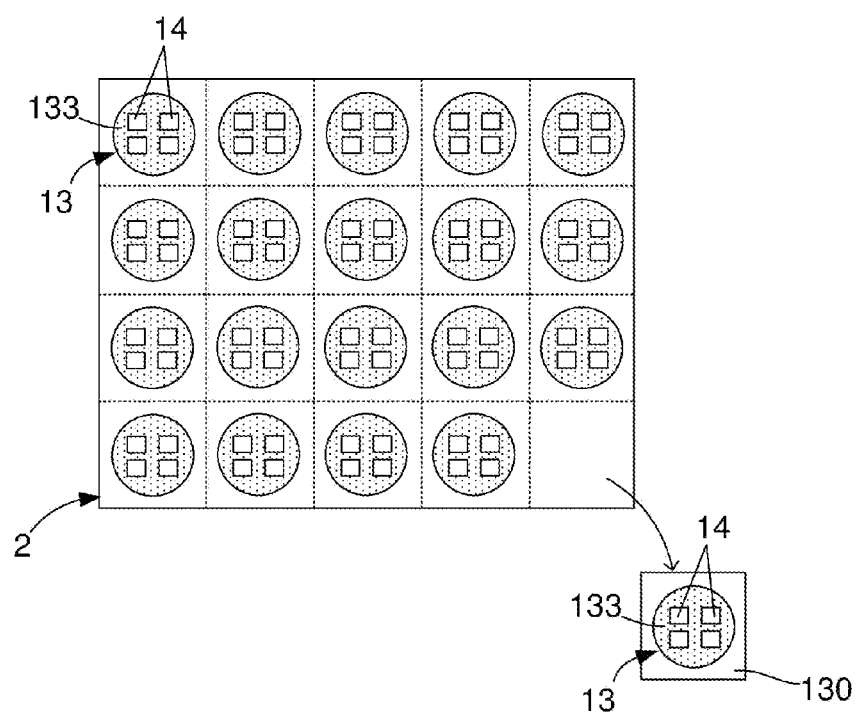

With reference to FIGS. 4 and 7F, the method of mounting the self-adhesive substrate on the electronic device further comprises steps of (SO4) removing each self-adhesive substrate 13, (S05) removing the release layer 130 from each self-adhesive substrate 13 to adhere each self-adhesive substrate 13 on the fixing portion 111 of the accommodating member 11 of the electronic device 1, as shown in FIGS. 8 to 14.

Figure 15:
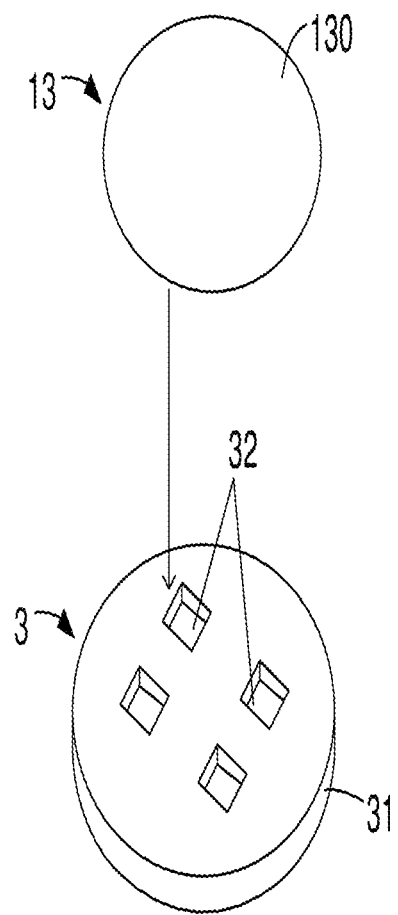
FIG. 15 is a perspective view showing the exploded components of a mounting fixture according to another preferred embodiment of the present invention.
Figure 16:
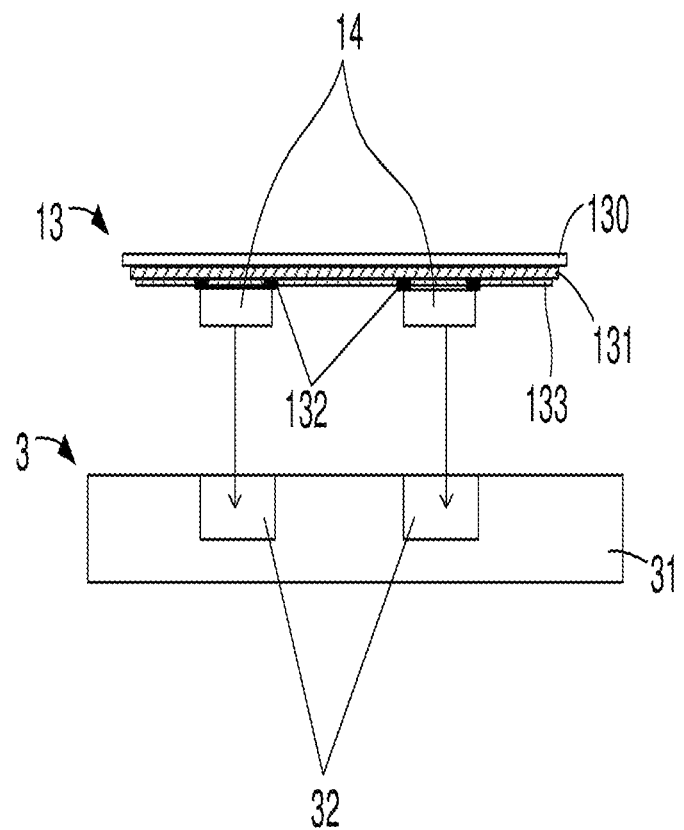
FIG. 16 is a cross sectional view of the mounting fixture and a plurality of electronic elements according to another preferred embodiment of the present invention.

After removing the release layer 130 from each self-adhesive substrate 13 in a step of (505), adhering each self-adhesive substrate 13 on the fixing portion 111 of the accommodating member 11 of the electronic device 1 by ways of a mounting fixture 3, as illustrated in FIGS. 15 and 16. The mounting fixture 3 includes a body 31 and plural holes 32 defined on the body 31. Thereafter, each self-adhesive substrate 13 is placed on the body 31, and the plurality of electronic elements 14, welded with each self-adhesive substrate 13, are retained in the plural holes 32.

Figure 17A:
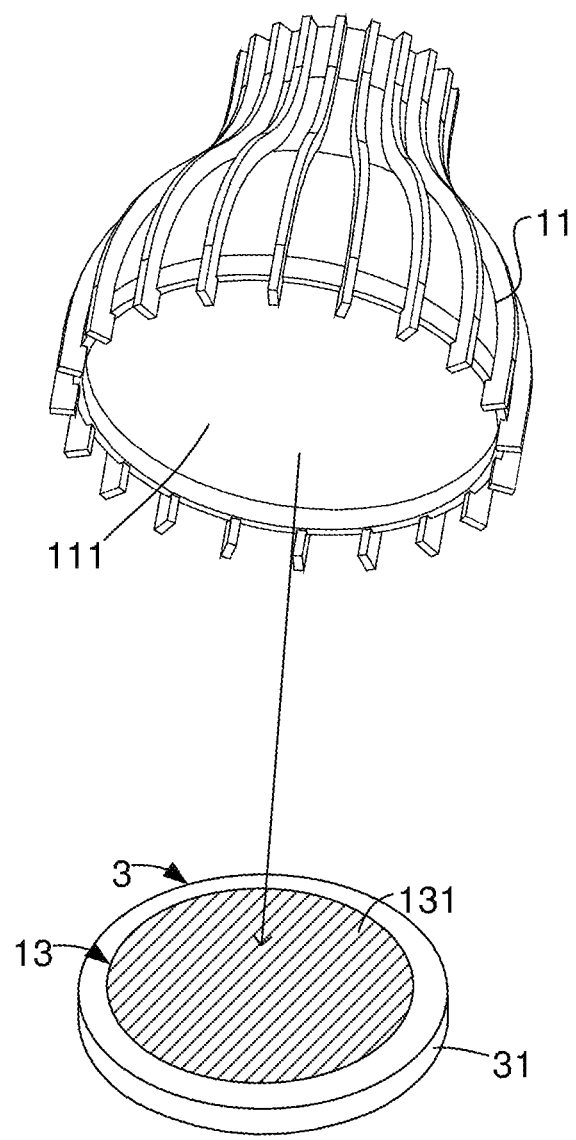
FIG. 17A is a perspective view showing the self-adhesive substrate being mounted on a fixing portion of an accommodating member according to another preferred embodiment of the present invention.
Figure 17B:
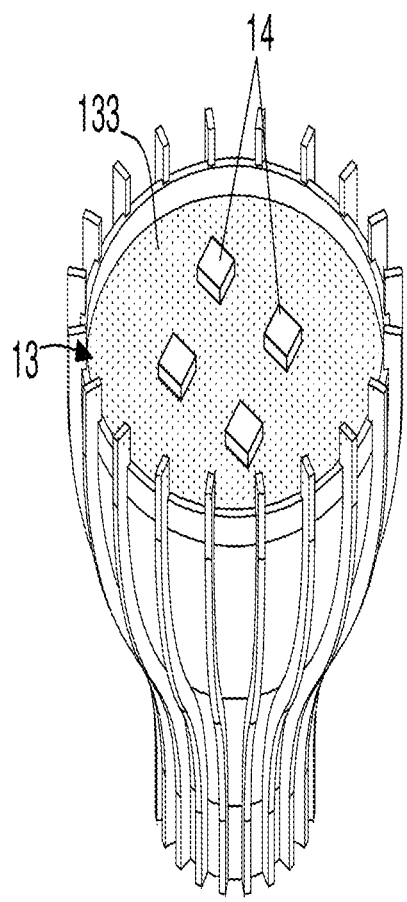
FIG. 17B is a perspective view showing the self-adhesive substrate being mounted on the fixing portion of the accommodating member according to another preferred embodiment of the present invention.

Referring to FIG. 17A, the insulated adhering layer 131 is adhered on the fixing portion 111 of the accommodating member 11. As shown in FIG. 17B, the mounting fixture 3 is removed from each self-adhesive substrate 13, thus mounting each self-adhesive substrate 13 on the fixing portion 111 of the accommodating member 11 of the electronic device 1, such as a LED bulb.

Figure 18A:
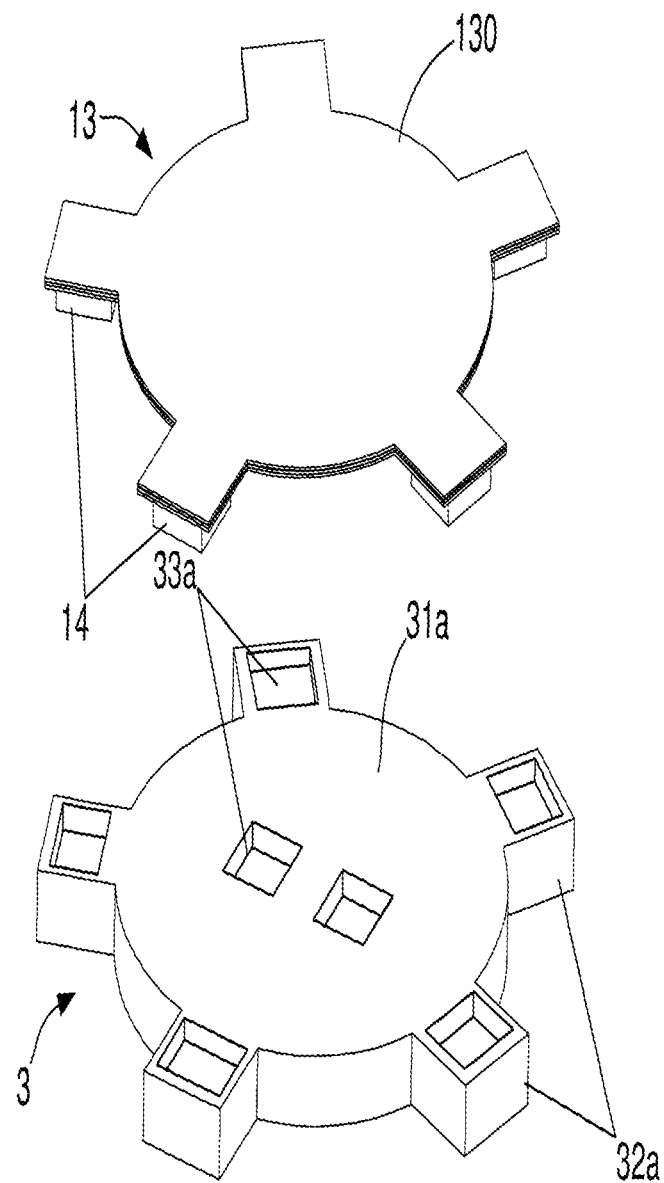
FIG. 18A is a perspective view showing each self-adhesive substrate being mounted on a mounting fixture according to another preferred embodiment of the present invention.
Figure 18B:
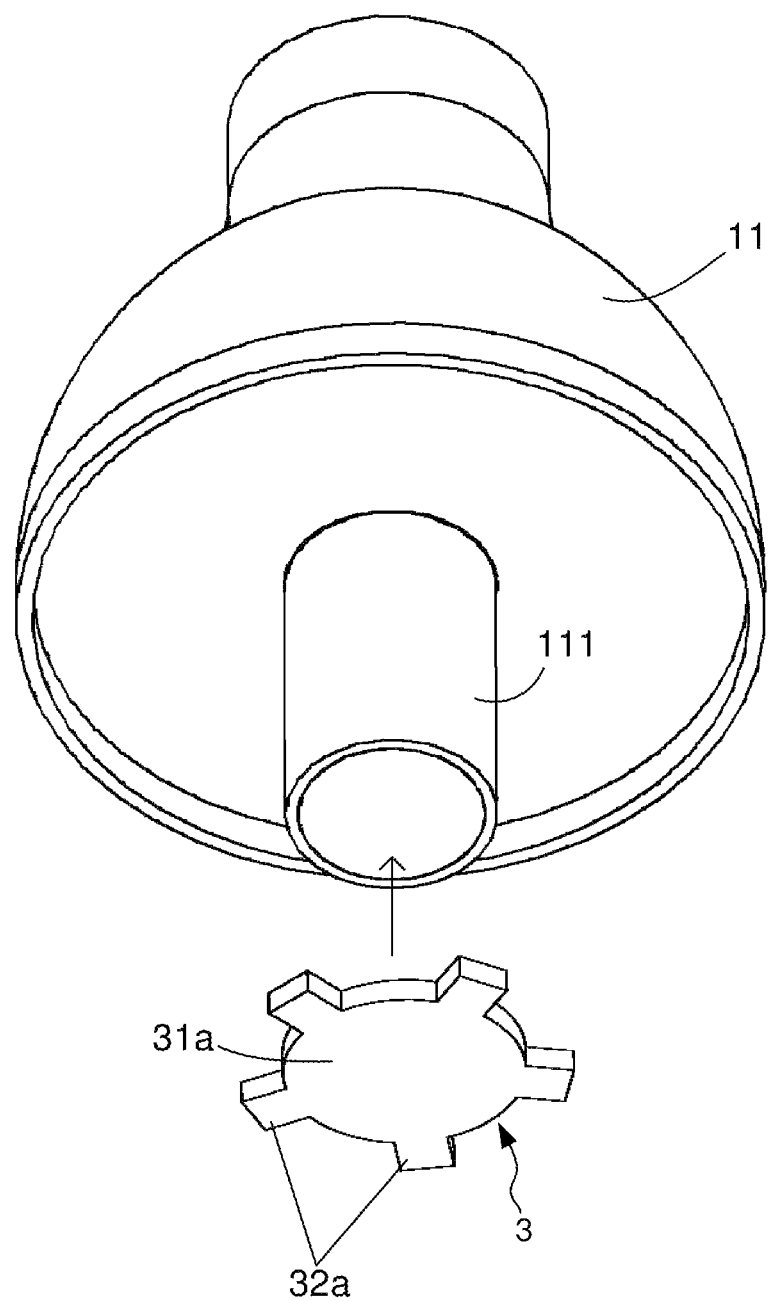
FIG. 18B is a perspective view showing the mounting fixture being removing from the fixing portion of the accommodating member according to another preferred embodiment of the present invention.
Figure 18C:
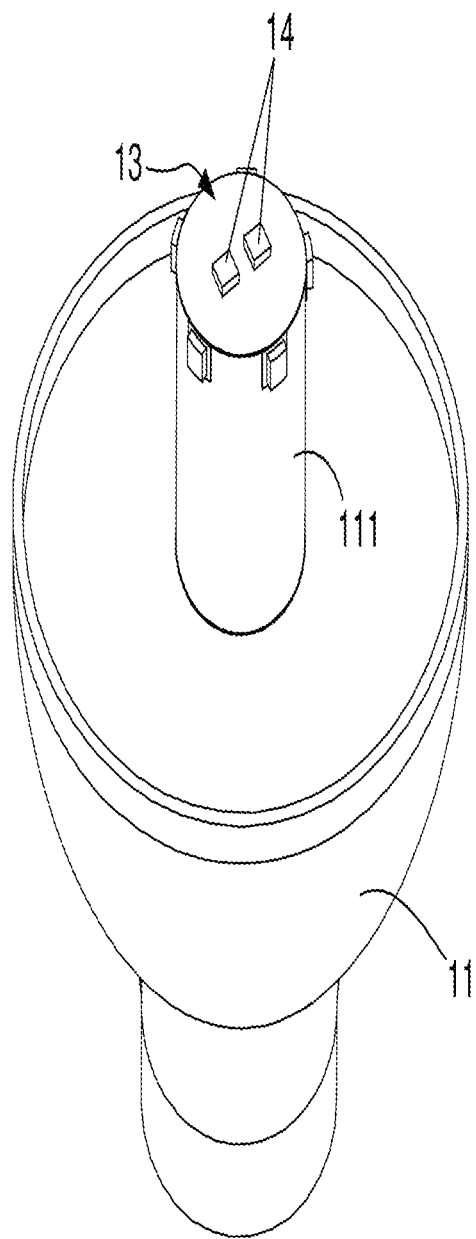
FIG. 18C is a perspective view showing the accommodating member being a fixing mount of the omni-directional LED bulb according to another preferred embodiment of the present invention.

As illustrated in FIG. 18A, in another preferred embodiment, a mounting fixture 3 includes a central affixing portion 31a, plural flexible tabs 32a connecting with the central affixing portion 31a, and a plurality of apertures 33a defined on the central affixing portion 31a and the plural flexible tabs 32a. Each self-adhesive substrate 13 and the plurality of electronic elements 14 are placed on the central affixing portion 31a and the plural flexible tabs 32a so that the plurality of electronic elements 14 are retained in the plurality of apertures 33. With reference to FIG. 18B, after removing the release layer 130 from each self-adhesive substrate 13, the accommodating member 11 is turned upside down and then is placed on each self-adhesive substrate 13 so that the insulated adhering layer 131 is adhered on the fixing portion 111 of the accommodating member 1. Thereafter, the mounting fixture 3 is removed from each self-adhesive substrate 13, thus mounting each self-adhesive substrate 13 on the fixing portion 111 of the accommodating member 11 of the electronic device 1. Referring to FIG. 18C, the accommodating member 11 is a fixing mount of the omni-directional LED bulb.

Figure 19:
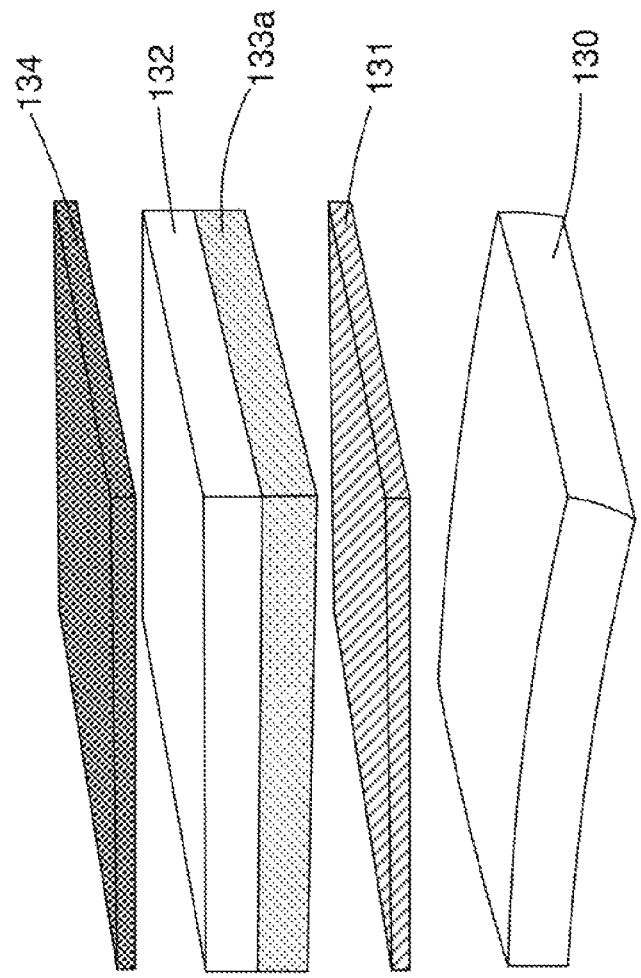
FIG. 19 is a perspective view showing the exploded components of the self-adhesive substrate according to another preferred embodiment of the present invention.

As illustrated in FIG. 19, in another embodiment, each self-adhesive substrate 13 includes a copper circuit layer 132 formed thereon, an insulated adhering layer 131 adhered with the copper circuit layer 132, a release layer 130 attached with the insulated adhering layer 131, a first insulation layer 133a separating the copper circuit layer 132 from the insulated adhering layer 131, and a printing layer 134 printed on the copper circuit layer 132.

Figure 20A:
FIG. 20A is a cross sectional view showing adhering an insulation layer and a copper layer together according to another preferred embodiment of the present invention.
Figure 20B:
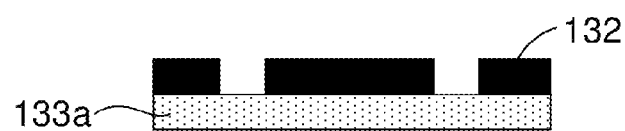
FIG. 20B is a cross sectional view showing the copper layer being processed to form a copper circuit layer according to another preferred embodiment of the present invention.
Figure 20C:
FIG. 20C is a cross sectional view showing the printing layer being printed on the copper circuit layer according to another preferred embodiment of the present invention.
Figure 20D:
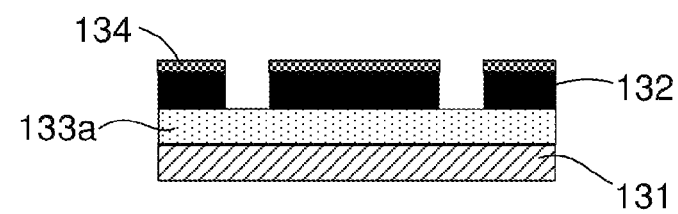
FIG. 20D is a cross sectional view showing the insulation layer being adhered with the insulated adhering layer according to another preferred embodiment of the present invention.

To mount the self-adhesive substrate 13 of FIG. 19, a method of mounting the self-adhesive substrate on the electronic device in another preferred embodiment comprises a step of (S01) providing a second insulation layer 133a and a copper layer 132a and adhering the second insulation layer 133a and the copper layer 132a together, as shown in FIG. 20A. Referring further to FIG. 20B, the copper layer 132a is processed to form a copper circuit layer 132. As shown in FIG. 20C, the printing layer 134 is printed on the copper circuit layer 132. As illustrated in FIG. 20D, the second insulation layer 133a is adhered with the insulated adhering layer 131.

Figure 21:
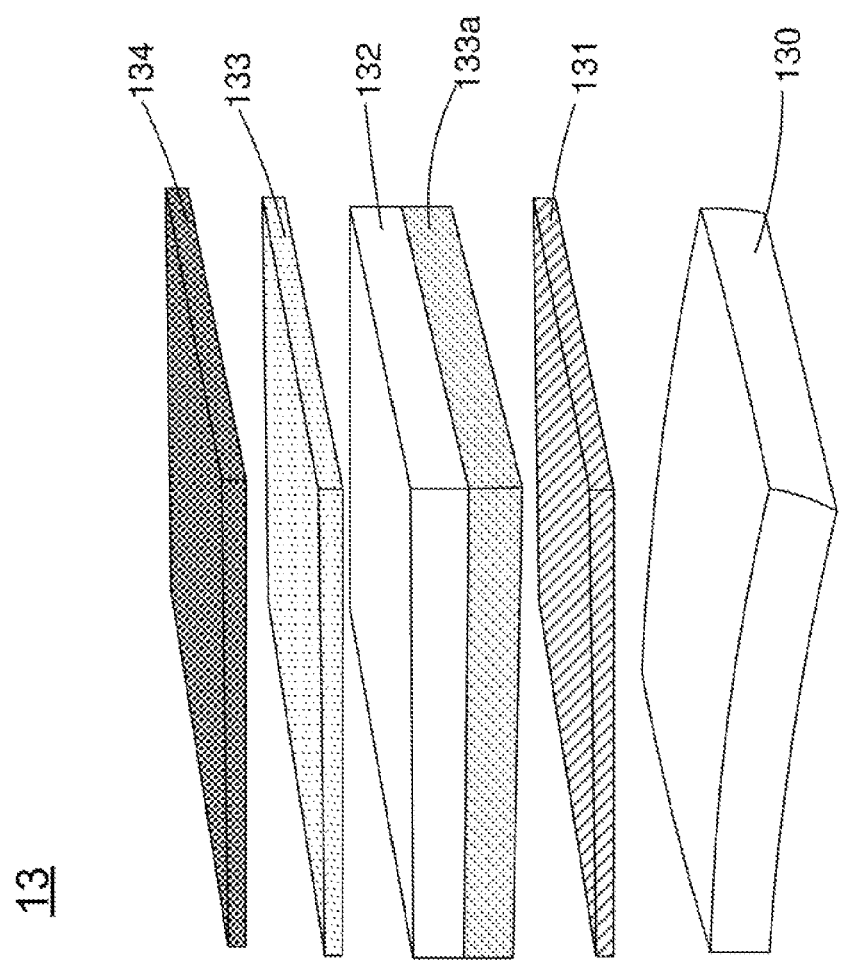
FIG. 21 is a perspective view showing the exploded components of the self-adhesive substrate according to another preferred embodiment of the present invention.

With reference to FIG. 21, in another embodiment, each self-adhesive substrate 13 at least includes a printing layer 134, a first insulation layer 133, a copper circuit layer 132, a second insulation layer 133a, and an insulated adhering layer 131.

Figure 22A:
FIG. 22A is a cross sectional view showing adhering an insulation layer and a copper layer together according to another preferred embodiment of the present invention.
Figure 22B:
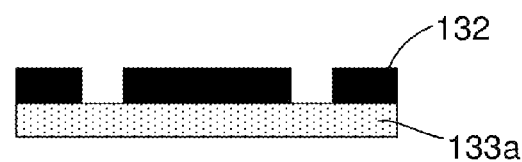
FIG. 22B is a cross sectional view showing the copper layer being processed to form a copper circuit layer according to another preferred embodiment of the present invention.
Figure 22C:
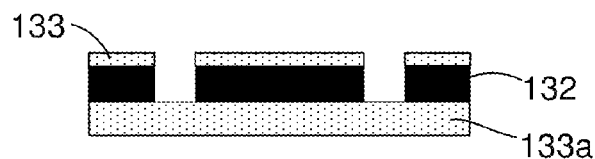
FIG. 22C is a cross sectional view showing a first insulation layer being processed and adhered with the copper layer according to another preferred embodiment of the present invention.
Figure 22D:
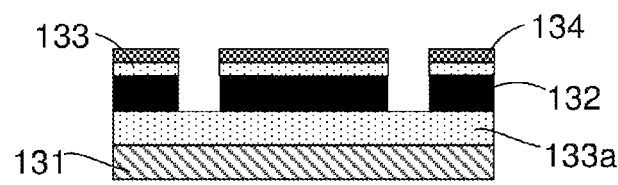
FIG. 22D is a cross sectional view showing the printing layer being printed on first insulation layer, and the second insulation layer being adhered with the insulated adhering layer according to another preferred embodiment of the present invention.

To mount the self-adhesive substrate 13 of FIG. 21, a method of mounting the self-adhesive substrate on the electronic device in another preferred embodiment comprises a step of (S01) providing a second insulation layer 133a and a copper layer 132a and adhering the second insulation layer 133a and the copper layer 132a together, as shown in FIG. 22A. Referring further to FIG. 22B, the copper layer 132a is processed to form a copper circuit layer 132. As shown in FIG. 22C, a first insulation layer 133 is processed and adhered with the copper layer 132a. As illustrated in FIG. 20D, the printing layer 134 is printed on first insulation layer 133, and the second insulation layer 133a is adhered with the insulated adhering layer 131.

Figure 23:
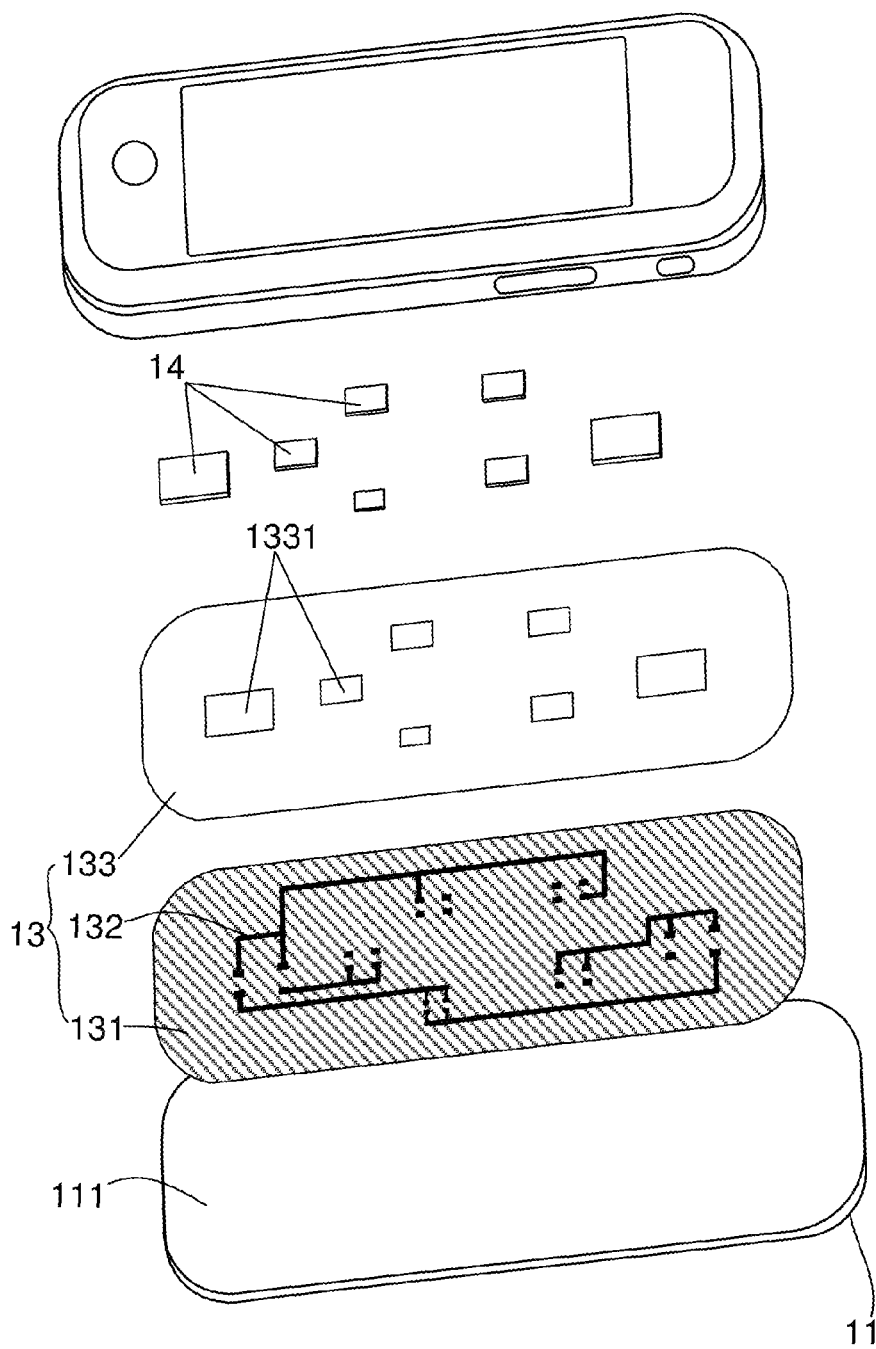
FIG. 23 is a perspective view showing the exploded components of a LED bulb according to another preferred embodiment of the present invention.

With reference to FIG. 23, the electronic device 1 is a smart phone, and a plurality of electronic elements 14 are welded with a self-adhesive substrate 13. The self-adhesive substrate 13 at least one includes an insulated adhering layer 131, a copper circuit layer 132, and a first insulation layer 133 which are adhered on a fixing portion 111 of an accommodating member 11 of the electronic device 1.

Figure 24:
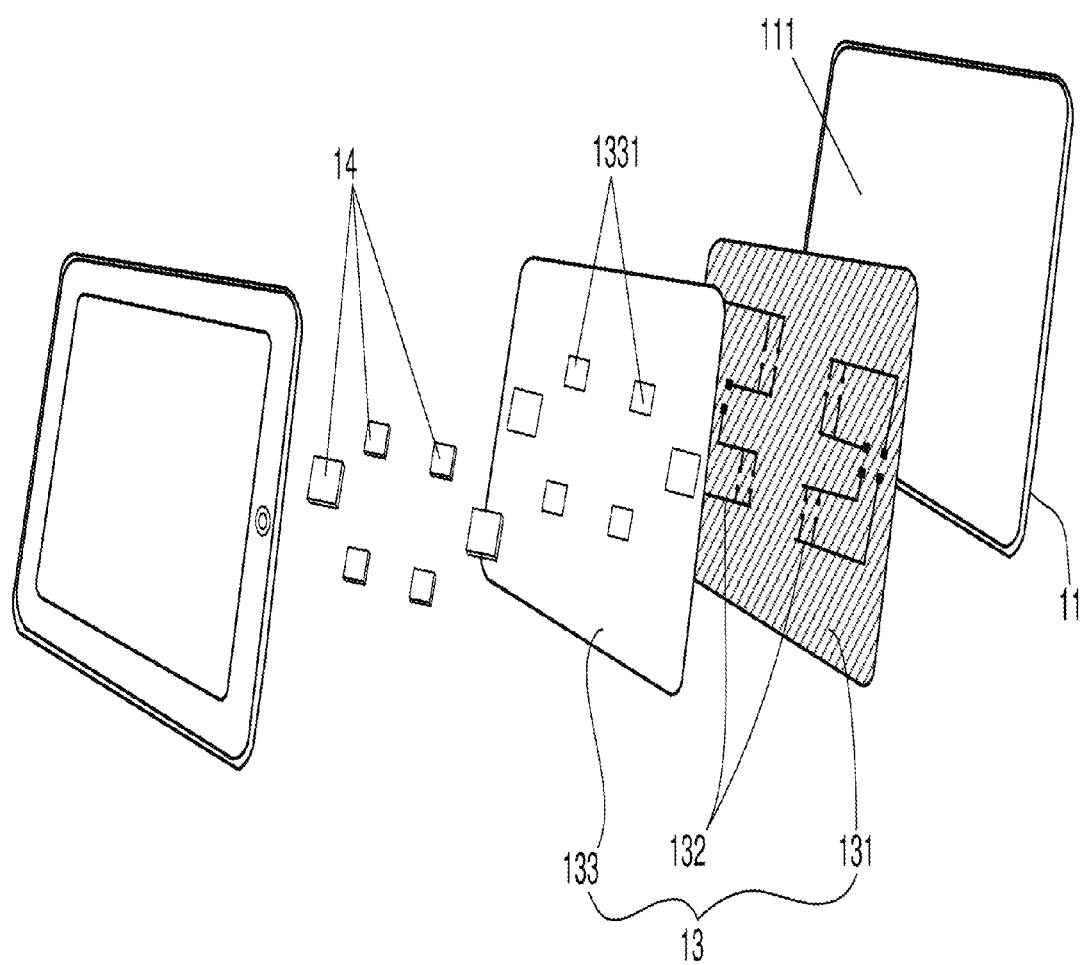
FIG. 24 is a perspective view showing the exploded components of a tablet PC according to another preferred embodiment of the present invention.

With reference to FIG. 24, the electronic device 1 is a tablet PC, and a plurality of electronic elements 14 are welded with a self-adhesive substrate 13. The self-adhesive substrate 13 at least one includes an insulated adhering layer 131, a copper circuit layer 132, and a first insulation layer 133 which are adhered on a fixing portion 111 of an accommodating member 11 of the electronic device 1.

Thereby, the method of mounting the self-adhesive substrate on the electronic device is employed to mount the self-adhesive substrate 13 on the electronic device 1 directly so that heat is transmitted to air from the plurality of electronic elements 14 via the self-adhesive substrate 13 and the electronic device 1.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method of mounting a self-adhesive substrate on an electronic device comprising steps of:
    (1) providing a base and forming at least one self-adhesive substrate, wherein each self-adhesive substrate includes a copper circuit layer formed thereon, an insulated adhering layer bonded to the copper circuit layer and made of glue with thermal conductive powders, and a release layer bonded to the insulated adhering layer;
    (2) fixing the at least one self-adhesive substrate on the base based on a shape or a circuit configuration of a bonding area of a surface of an electronic device, and mounting the base on the electronic device;
    (3) welding a plurality of electronic elements on the copper circuit layer of each self-adhesive substrate;
    (4) removing each self-adhesive substrate from the base;
    (5) removing the release layer from each self-adhesive substrate to adhere each self-adhesive substrate on the bonding area of the surface of the electronic device.

2. The method of mounting the self-adhesive substrate on the electronic device as claimed in claim 1, wherein step (1) includes sub-steps of:
    (1a) providing a first insulation layer and a copper layer;
    (1b) adhering the first insulation layer and the copper layer together;
    (1c) processing the copper layer to form the copper circuit layer;
    (1d) printing a printing layer printed on the copper circuit layer;
    (1e) adhering the first insulation layer with the insulated adhering layer.

3. The method of mounting the self-adhesive substrate on the electronic device as claimed in claim 1, wherein the electronic device is any one of a LED light bar, a LED lamp, a LED backlight, a tablet PC, a cell phone, a LED display, and a LED lighting tube.

4. The method of mounting the self-adhesive substrate on the electronic device as claimed in claim 1, wherein each electronic element is any one of a LED chip, an integrated circuit chip, a capacitor, a resistor, an inductor, a transformer, an oscillator, and a sensor.

5. The method of mounting the self-adhesive substrate on the electronic device as claimed in claim 1, wherein a second insulation layer is adhered on the copper circuit layer to protect the copper circuit layer.

6. The method of mounting the self-adhesive substrate on the electronic device as claimed in claim 1, wherein the printing layer has a specific color.

7. The method of mounting the self-adhesive substrate on the electronic device as claimed in claim 1, wherein the colorful paint is any one of a white paint, a green paint, and a yellow paint.

8. The method of mounting the self-adhesive substrate on the electronic device as claimed in claim 1, wherein in step of (3), when welding the plurality of electronic elements on the copper circuit layer of each self-adhesive substrate, the base is delivered to a testing area so as to test each electronic element.

9. The method of mounting the self-adhesive substrate on the electronic device as claimed in claim 1, wherein step (5) includes sub-steps of:
    (5a) providing a mounting fixture, wherein the mounting fixture includes a central affixing portion, plural flexible tabs connecting with the central affixing portion, and a plurality of apertures defined on the central affixing portion and the plural flexible tabs;

(5b) placing each self-adhesive substrate and the plurality of electronic elements on the central affixing portion and the plural flexible tabs so that the plurality of electronic elements are retained in the plurality of apertures;

(5c) removing the release layer from each self-adhesive substrate, turning the surface of the electronic device upside down and placing the accommodating member on each self-adhesive substrate so that the insulated adhering layer is adhered on the bonding area of the surface of the electronic device;

(5d) removing the mounting fixture from each self-adhesive substrate.

\* \* \* \* \*